United States Patent [19]

Takeda

[11] Patent Number: 5,706,076
[45] Date of Patent: Jan. 6, 1998

[54] SEMICONDUCTOR LIGHT EXPOSURE APPARATUS

[75] Inventor: Minoru Takeda, Kanagawa, Japan

[73] Assignee: Sony Corporation, Tokyo, Japan

[21] Appl. No.: 377,545

[22] Filed: Jan. 24, 1995

[30] Foreign Application Priority Data

Jan. 25, 1994 [JP] Japan .................... 6-006406

[51] Int. Cl.$^6$ .................... H01L 21/30
[52] U.S. Cl. .................... 355/53; 355/69
[58] Field of Search .................... 355/53, 72, 67, 355/69; 372/21, 22, 29, 32

[56] References Cited

U.S. PATENT DOCUMENTS

| | | | |
|---|---|---|---|
| 5,097,291 | 3/1992 | Suzuki | 355/69 |
| 5,309,198 | 5/1994 | Nakagawa | 355/67 |
| 5,367,531 | 11/1994 | Eguchi et al. | 372/98 |
| 5,459,547 | 10/1995 | Shiozawa | 355/67 |

Primary Examiner—Arthur T. Grimley
Assistant Examiner—David A. Lane
Attorney, Agent, or Firm—Jerry A. Miller; Harold Fujii

[57] ABSTRACT

A semiconductor light exposure apparatus includes an excitation light source, a light beam generating device, a controller and a contracting optical system. The light beam generating device generates a fundamental wavelength laser light beam when excited by a light beam from the excitation light source, and wavelength-converts the fundamental wavelength laser light beam into a second harmonics laser light beam by a first resonator having a first non-linear optical crystal element while also converting the second harmonics laser light beam into a second harmonics laser light beam by a second resonator having a second non-linear optical crystal element. The controller controls an output of the excitation light source in order to control an output of the fourth-order harmonics laser light beam from the light beam generating device. The contracting optical system projects a pattern in a contracted size on a wafer by the fourth-order harmonics laser light beam outputted from the optical beam generating device.

11 Claims, 3 Drawing Sheets

SEMICONDUCTOR LIGHT EXPOSURE APPARATUS

BACKGROUND

1. Field of the Invention

The present invention relates to a semiconductor light exposure apparatus. More particularly, the present invention relates to a semiconductor light exposure apparatus for effectuating light exposure using a laser light beam of high harmonics generated from a non-linear optical crystal element.

2. Background of the Invention

A semiconductor light exposure apparatus is used for exposing a photosensitive coating film formed on a wafer, that is a so-called resist film, with the aid of a light source of a short wavelength range for improving the integration degree. However, in keeping up with the tendency towards higher integration of semiconductor memories, such as dynamic random access memories (DRAMs), higher resolution is demanded of the semiconductor light exposure apparatus, and hence investigations into an exposure light source having an exposure light beam of a shorter wavelength are proceeding briskly. There is known a method of shortening the light beam wavelength using an excimer laser as a light source. The excimer laser is designed to produce laser oscillations in electrical discharge in a mixture of harmful gases including the combination of rare gases and halogen gases, with the laser wavelength being for example, 248 nm for KrF and 193 nm for ArF, respectively.

However, since the excimer laser is a pulse-oscillated gas laser, the spatial laser light beam intensity distribution is subjected to considerable fluctuations. On the other hand, since the pulse output is fluctuated significantly from one pulse to another, it is difficult to control the amount of light exposure. The sensitivity of a resist film that may be employed in the wavelength range of the excimer laser differs from one film type to another, such that, while a film of high sensitivity is sensitized by a few pulses, a film of low sensitivity is in need of thousands of laser pulses. As a result of difference in sensitivity of the resist film, it is extremely difficult to continuously adjust the excimer laser output. On the other hand, the low sensitivity resist film leads to prolonged exposure time and to a lower throughput. Besides, it is necessary with the excimer laser to carry out oscillations for a pre-set time before light exposure for the wafer in order to assure stable laser oscillations, thus leading to wasteful power consumption during the non-light-exposure period for the wafer, that is during the so-called idling period.

SUMMARY OF THE INVENTION

It is therefore an object of the present invention to provide a semiconductor light exposure apparatus which resolves the above-mentioned problems.

In one aspect, the present invention provides a semiconductor light exposure apparatus including an excitation light source, a light beam generating device, a controller and a contracting optical system. The light beam generating device generates a fundamental wavelength laser light beam as a basic wave laser light by being excited by a light beam from the excitation light source, and wavelength-converts the fundamental wavelength laser light beam of the second harmonics laser light beam by a first resonator having a first non-linear optical crystal element, while also converting the second harmonics laser light beam into the second harmonics laser light beam by a second resonator having a second non-linear optical crystal element. The controller controls an output of the excitation light source for controlling an output of the fourth-order harmonics laser light beam from the light beam generating device. The contracting optical system projects a pattern in a contracted size on a wafer by the fourth-order harmonics laser light beam outputted by the light beam generating device.

In another aspect, the present invention provides a semiconductor light exposure apparatus including an excitation light source, a light beam generating device, a controller and a contracting optical system. The light beam generating device has a first resonator, a second resonator and a light volume controller. The first resonator has a laser medium excited by a laser light beam from the excitation light source and a first non-linear optical crystal element for generating a second harmonics laser light beam according to the fundamental wavelength laser light beam radiated from the laser medium. The second resonator has a second non-linear optical crystal element for generating a fourth-order harmonics laser light beam with respect to the second harmonics laser light beam from the first resonator. The light volume controller controls the output of the excitation light source for controlling the output of the fourth-order harmonics laser light beam from the second resonator. The semiconductor light exposure apparatus further includes the contracting optical system for contracting the size of a pattern on a reticle and projecting the pattern on a wafer by a fourth-order harmonics laser light beam outputted by the light beam generating device, and a position controller means for controlling the light exposure position of the wafer on the contracting optical system.

According to the present invention, the volume of light exposure for the wafer may be continuously adjusted by controlling an output of the fourth harmonics laser light beam with respect to the fundamental wavelength laser light beam as the basic wave laser light beam generated in the first resonator of the light beam generating device for effecting light exposure for continuously adjusting the light exposure volume for the wafer.

DESCRIPTION OF THE INVENTION

Referring to the drawings, an embodiment of the semiconductor light exposure apparatus according to the present invention will be explained in detail.

The semiconductor light exposure apparatus is a photolithographic apparatus which radiates the exposure light beam from a light source to a resist film formed on a wafer via an illuminating optical system and a contracting projection optical system and forms a pattern on a reticle; that is, it forms a so-called original picture pattern, on a resist film on the wafer with a size equal to, for example, one-fifth of the original size.

Figure 1:
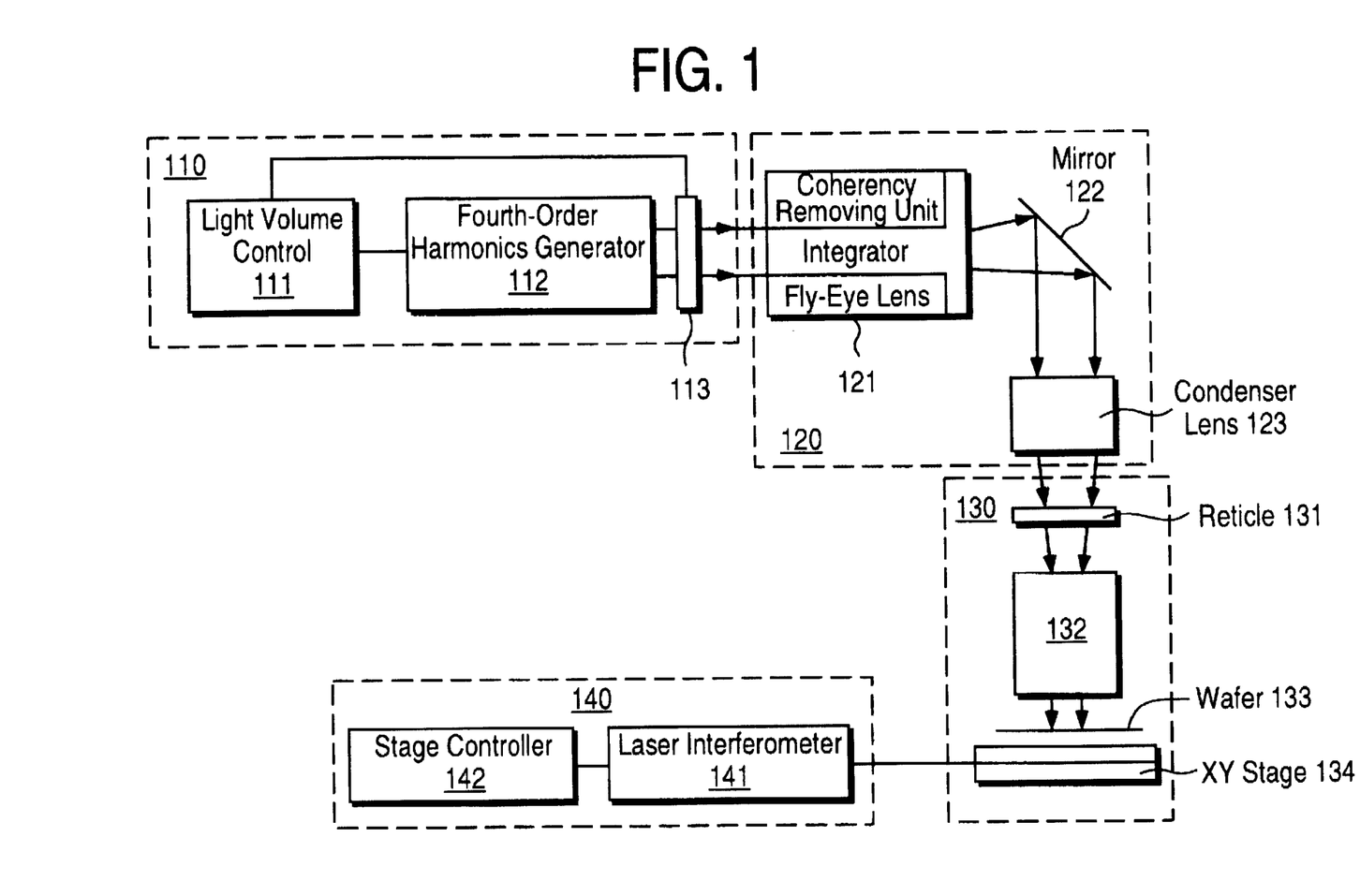
FIG. 1 shows a semiconductor light exposure apparatus according to the present invention.

The semiconductor light exposure apparatus has a laser light source unit 110 for radiating a laser light beam of the fourth-order harmonics as later explained, a uniforming unit 120 for uniforming the intensity distribution of the outgoing light beam from the laser light source 110, a light exposure unit 130 for forming on the wafer a pattern contracted in size to one-fifth of the original picture pattern, and a position control unit 140 for forming the contracted pattern at the desired position on the wafer, as shown in FIG. 1.

The laser light source unit 110 has a light volume controller 111 for adjusting the light volume of a laser light beam which is the fourth harmonics of the laser light beam of the fundamental wavelength as later explained, a fourth harmonics wave generator 112 for radiating the adjusted fourth harmonics laser light beam and a shutter 113 adapted for being opened and closed under control by the light volume controller 111.

The uniforming unit 120 includes an integrator 121 for lowering the coherency of the fourth harmonics laser light beam outputted from the laser light source 110 and for uniforming the spatial light intensity distribution, a mirror 122 for deflecting the optical path of the laser light beam from the integrator 121, and a condenser lens 123 for adjusting the light beam as the laser light beam for efficient irradiation of the reticle 131. The integrator 121 has a coherency removing unit (not shown) for lowering the coherency proper to the fourth harmonics laser light beam and a fly-eye lens (not shown) for uniforming the spatial light intensity distribution.

The light exposure unit 130 includes a reticle 131 having the original picture pattern formed thereon, a contracting projecting lens 132 for projecting a light image of the original picture pattern reduced in size to one-fifth of the original picture pattern, and an X—Y stage 134 for moving the wafer 133 longitudinally and horizontally. The wafer 133 has an alignment mark, not shown, for aiding in correct transcription of the pattern at a pre-set position on the wafer.

The position controller 140 has a laser interferometer 141 for detecting the position of the return light beam from the wafer 133 of the light exposure unit 130 by detecting the position of the alignment mark on the wafer, and a stage controller 142 for moving the X—Y stage 134 of the light exposure unit 130 according to the detection output from the laser interferometer 141.

Figure 2:
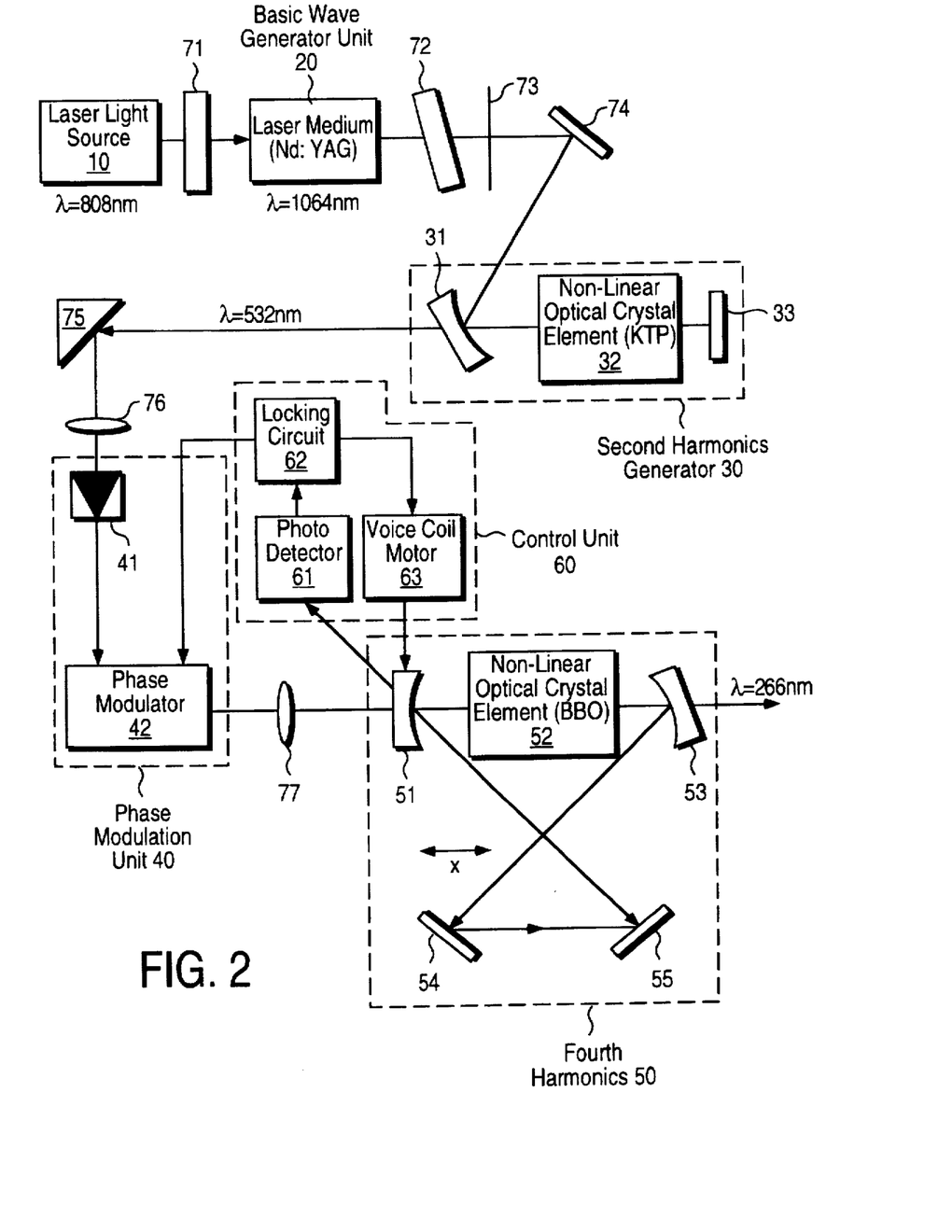
FIG. 2 shows a fourth-order harmonics generator in the semiconductor light exposure apparatus according to the present invention.

Referring to FIG. 2, the laser light source unit 110 for radiating the fourth-order harmonics laser light beam is explained. In FIG. 2, the fourth harmonics generator 112 of the laser light source unit 110 includes a laser light source 10 for radiating an excitation laser light beam, a basic wave generating unit 20 excited by an exciting laser light beam from the laser light source 10 for generating a fundamental wavelength light beam as a basic wave laser light beam and a second harmonics generating unit 30 having a first non-linear optical crystal element for wavelength-converting the fundamental wavelength light beam into a laser light beam of the second harmonics. The fourth harmonics generator 112 also includes a phase modulation unit 40 for phase modulation of the second harmonics laser light beam radiated from the second harmonics generating unit 30, and a fourth harmonics generating unit 50 having a second non-linear optical crystal element for wavelength-converting the second harmonics laser light beam into a fourth harmonics laser light beam which is outputted. The fourth harmonics generator 112 further includes a controller 60 for controlling the fourth harmonics generating unit 50 for satisfying the conditions of generation of the fourth harmonics laser light beam.

The laser light source 10 has at least one semiconductor laser for radiating an excitation laser light beam preferably having a wavelength of 808 nm. The basic wave generating unit 20 has a Nd:YAG as the laser medium, as an example, and is excited by the excitation laser light for generating a fundamental wavelength laser light beam having a wavelength of 1064 nm.

The second-order harmonics generating unit 30 has a first resonator which is made up of a concave mirror 31 for producing resonation at a wavelength of the laser light beam of the fundamental wavelength, a plane mirror 33 and a non-linear optical crystal element 32 provided between the concave mirror 31 and the plane mirror 33. The first non-linear optical crystal element 32 is preferably formed of KTiOPO$_4$ (KTP) and wavelength-converts the fundamental wavelength laser light beam into the second harmonics laser light beam. The reflective surface of the plane mirror 33 reflects the fundamental wavelength laser light beam and the second harmonics laser light beam, while the reflective surface of the concave mirror 31 reflects the fundamental wavelength laser light beam and transmits only the second harmonics laser light beam. Resonation at the wavelength of the incident fundamental wavelength laser light beam is generated by the plane mirror 33 and the concave mirror 31. Since the first non-linear optical crystal element 32 is provided between the plane mirror 33 and the concave mirror 31, the fundamental wavelength laser light beam is wavelength-converted into the second harmonics laser light beam under the non-linear optical effect of the first non-linear optical crystal element 32. Thus the second harmonics laser light beam having the wavelength of 532 nm is output from the concave mirror 31.

The phase modulation unit 40 is composed of a phase modulator 42 for phase-modulating the second harmonics laser light beam and an optical isolator 41 for preventing reversion of the light beam incident on the phase modulator 42 having, for example, an electro-optical effect device. The phase modulator 42 is supplied to the position error detected by a control unit 60 as later explained. The phase modulator 42 phase-modulates the second harmonics laser light beam for detecting the light volume of the control unit 60 based on the position error. The second harmonics laser light beam, having the frequency of about 500 to 600 THz, performs phase modulation preferably at 10 MHz.

The fourth harmonics generating unit 50 has a second resonator composed of a concave mirrors 51, 53 resonated at a wavelength of the second harmonics laser light beam, a second non-linear optical crystal element 52 provided between the concave mirrors 51, 53, and plane mirrors 54, 55 mounted facing the concave mirrors 54, 55. The second non-linear optical crystal element 52, formed e.g. of barium borate (BBO), wavelength-converts the second harmonics laser light beam into fourth harmonics laser light beam. The reflective surfaces of the concave mirrors 51, 53 are coated with reflective films capable of transmitting only the fourth harmonic laser light beam. The concave mirror 51 is driven along the optical axis by the control unit 60 as later explained, as indicated by an arrow X in FIG. 2, for satisfying the conditions of laser oscillation. On the other hand, for increasing the laser light path during resonation, the plane mirrors 54, 55 are mounted facing the concave mirrors 51, 53. Since the second non-linear optical crystal element 52 is provided between the concave mirrors 51 and 53, the second harmonics laser light beam is wavelength-converted into the fourth harmonics laser light beam under the non-linear optical effect proper to the second non-linear optical effect. Thus the fourth harmonics laser light beam having the wavelength of 266 nm is output from the concave mirrors 51, 53.

For the fourth harmonics generating unit 50, a Fabry-Perot resonator made up of two concave mirrors facing each other is employed preferably. The Fabry-Perot resonator is set into resonant oscillations at a optical path phase difference equal to 2π, with the phase of reflection being significantly changed in the vicinity of the phase of resonation. It is disclosed in "Laser Phase and frequency Stabilization Using an Optical resonator", by R. W. P. Drever et al., in Applied Physics B 31.97–105 (1983) to control the frequency of the resonator by taking advantage of such phase change. It is this technique that is utilized in the fourth harmonics generating unit 50.

The control unit 60 is composed of a photodetector 61, such as a photodiode, for detecting the light volume of the fourth harmonics laser light beam, a lock circuit 62 for realizing high precision position error detection according to the detected light volume and a voice coil motor 63 for driving the concave mirror 51 of the fourth harmonics generating unit 50. The position error detected by the lock circuit 62 is supplied to the voice coil motor 63 and to the phase modulator 42 of the phase modulation unit 40. The voice coil motor 63 drives the concave mirror 51 of the fourth harmonics generating unit 50 along the optical axis as indicated by the arrow X in FIG. 2 for reducing the phase error to zero.

The fourth harmonics laser light beam is generated in the following manner by the above-described fourth harmonics generating unit 112. Specifically, the laser light source 10 radiates the exciting laser light beam. The laser light beam is converted by a quarter wave plate 71 from the linear polarized state into the circular polarized state. The laser light beam outputted by the quarter wave plate 71 is incident on the basic wave generating unit 20. The basic wave generating unit 20, that is a Nd:YAG as a laser medium, is excited by the laser light beam through the quarter wave plate 71 for generating the fundamental wavelength laser light beam. The fundamental wavelength laser light beam is generated in bandwidth by an ethalon 72. The basic wave generating unit 20, reduced in bandwidth by the ethalon 72, is supplied to a pin-hole 73 from which a portion of the fundamental wavelength laser light beam is outputted. The fundamental wavelength laser light beam is reflected by the plane mirror 74 before being incident on a first resonator of the second harmonics generating unit 30. The second harmonics generating unit 30 is oscillated in resonance at the wavelength of the fundamental wavelength laser light beam. According to the fundamental wavelength laser light beam, the first non-linear optical crystal element 32 generates the second harmonics laser light beam. Thus the second harmonics laser light beam is outputted from the concave mirror 31 of the second harmonics generating unit 31. The second harmonics laser light beam has its optical path deflected 90° by a mirror 75 before being incident through a condenser lens 76 to the phase modulating unit 40. The second harmonics laser light beam, phase-modulated by the phase modulating unit 40, is incident through a condensing lens 77 on the second resonator of the fourth order harmonics generating unit 50. The fourth order harmonics generating unit 50 is oscillated in resonation at the wavelength of the second harmonics laser light beam. According to the second harmonics laser light beam, the second non-linear optical crystal element 52 generates the fourth harmonics laser light with respect to the second harmonic laser light beam. The fourth harmonics laser light beam for light volume detection is outputted from the fourth harmonics generating unit 50 through the concave mirror 51, while the fourth harmonics laser light beam for light exposure is outputted through the concave mirror 53. The outgoing fourth harmonics laser light beam is substantially proportionate to the volume of the excitation laser light beam radiated from the laser light source 10. The voice coil motor 63 is driven under control by the controlling unit 60 for driving the concave mirror 53 along the optical axis according to the detection signal from the photodetector 61 of the fourth harmonics laser light beam outputted through the concave mirror 51 as the light beam for light volume detection. Thus the length of the optical path of the fourth harmonics laser light beam in the fourth harmonics generating unit 50 is equal to the resonant point length.

With the above-described arrangement, the light volume of the fourth harmonics laser light beam, which is the output laser light beam for exposure through the concave mirror 53, or the output level, can be adjusted by adjusting the light volume of the excitation laser light beam.

The laser medium in the basic wave generating unit 20 may also be Nd:VO4, Nd:BEL or LNP, in place of Nd:YAG. The first non-linear optical crystal element 32 or the second non-linear optical crystal element 52 may also be formed of LN, QPN, LBO, KN or KDP (potassium dihydrogenphosphate) in place of KTP or BBO.

The operation of exposing a wafer to light using the fourth-order harmonics laser light beam from the fourth-order harmonics generating unit 112 is now explained by referring to FIG. 1. The light volume of the excitation laser light beam, radiated from the laser light source 10 of the fourth harmonics generating unit 112 shown in FIG. 2, is pre-adjusted by the light volume controlling unit 111 of the light source unit 110 so that the volume of the fourth harmonics laser light beam radiated from the fourth harmonics generating unit 112 is raised up to the volume of light exposure corresponding to sensitivity of the resist film on the wafer 133 in the light exposure unit 130. At this time, the X—Y stage 134 of the light exposure unit 130 is displaced longitudinally and transversely under control by the control unit 140 for positioning a chip a (not shown) set on the wafer 133 for correct light exposure. When the volume of the light beam of the fourth order harmonics for light exposure, radiated from the fourth-order harmonics generator 112, is raised to the volume of light exposure corresponding to the sensitivity of the resist film on the wafer 133, and the wafer 133 is fixed in position, the light volume control unit 111 causes a shutter 113 to be opened. Thus the fourth-order harmonics exposure laser light beam is radiated through the shutter 113 in a volume corresponding to the sensitivity of the resist film of the wafer 133. The laser light beam of the fourth order harmonics radiated from the laser light source unit 110 is incident on the uniforming unit 120. The shutter 113 may be designed for mechanically interrupting the fourth-order laser light beam or interrupting the fourth-order laser light beam based on the operation of a liquid crystal.

The integrator 121 of the uniforming unit 120 has the coherency removing device and the fly-eye lens, as described above. The fourth-order harmonics laser light, incident on the uniforming unit 120, is freed of coherence by the coherence removing device. The fly-eye lens is a prism-shaped lens having a double-eye optical system. The fourth-order harmonics laser light, freed of coherence, is transmitted through the fly-eye lens for uniforming the spatial light intensity distribution of the fourth-order harmonics laser light. The fourth-order harmonics laser light beam, thus uniformed in spatial light intensity distribution by the uniforming device 120, has its optical path deflected 90° by the mirror 122 before being incident on the condenser lens 123.

The condenser lens 123 adjusts the light beam of the fourth-order harmonics irradiated thereon for generating the laser light beam about 200 nm in diameter having uniform light intensity distribution. The fourth-order harmonics, thus condensed by the condenser lens 123, is incident on the light exposure unit 130.

The fourth-order harmonics laser light beam, incident on the light exposure unit 130, is incident through the reticle 131 on the contracting projection lens 132. The contracting projection lens 132 contracts the pattern formed on the reticle 131 to a one-fifth size to project the reduced-size pattern on the wafer 133. Thus a micro-sized pattern, contracted in size from the pattern of the reticle, is formed on the chip a of the wafer 133.

On completion of light exposure of the chip a, the shutter 113 is closed under control by the light volume controller 111 of the laser light source 110. The shutter 113 interrupts the fourth harmonics laser light beam radiated from the fourth harmonics generating unit 112.

The control unit 140 then controls the position of the chip b (not shown) to be exposed to light. The laser interferometer 141 detects the position of the alignment mark on the wafer from the return light beam from the wafer 133. The X—Y stage 134 is displaced under control by the stage controller 142, based on an output signal from the laser interferometer 141, so as to be position-controlled to permit correct exposure to light of the chip.

Once the chip b on the wafer 133 is fixed, the shutter 113 is opened under control by the light volume controller 111 of the laser light source unit 110. The fourth-order laser light beam is radiated from the fourth-order harmonics generator 112 through the shutter 113. Similarly to the chip a, the chip b on the wafer 133 is correctly exposed to light. On completion of light exposure to light of the wafer 133, the shutter 113 is again closed under control by the light volume controlling unit 111 of the laser light source unit 110.

With the above-described semiconductor light exposure apparatus, the X—Y stage 134 is displaced in a controlled manner for controlling the chip position, while light exposure is carried out for each chip as the shutter is opened or closed in a controlled manner. This permits the pattern on the reticle 131 to be transcribed correctly on the entire wafer.

Once the light exposure of the first wafer is completed, the light volume of the excitation laser light beam, radiated by the laser light source unit 10 of the fourth-order harmonics generator 112, is adjusted so that the volume of the fourth-order harmonics laser light beam radiated by the fourth-order harmonics is lowered to a minimum output necessary for maintaining stable oscillations. During the light exposure of the next wafer, the light volume of the excitation laser light beam, radiated by the laser light source unit 10 of the fourth-order harmonics generator 112, that is the output level, is adjusted so that the volume of the fourth-order harmonics laser light beam radiated by the fourth-order harmonics generator is raised to the exposure light volume corresponding to sensitivity of the resist film on the wafer.

Figure 3:
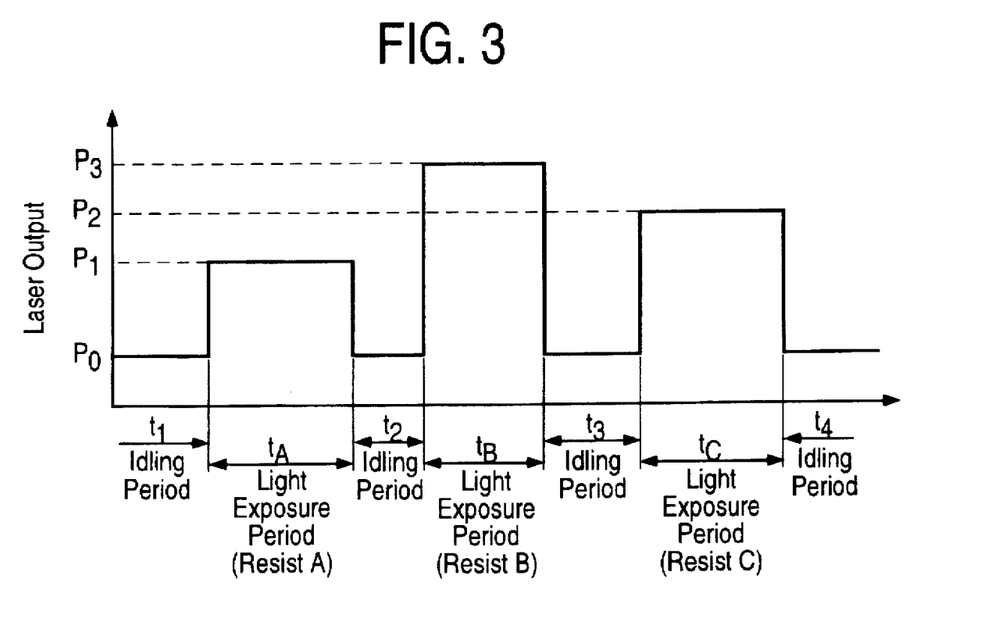
FIG. 3 is a waveform diagram showing an output level of an exposure laser light employed in the semiconductor light exposure apparatus according to the present invention.

Referring to FIG. 3, the hysteresis of the exposure light volume, that is the output level, in case of light exposure of three wafers having different sensitivities of resist films, is explained. The resist films of the three wafers are termed resist films A, B, and C. The order of resistivities of the resist films, that is energies of the required light exposure films, is represented by the resist film B>resist film C>resist film A. The light volume of the exposure laser light means the light volume of the fourth-order harmonics laser light beam, that is the output level, radiated by the fourth-order harmonics generating unit 112 by adjusting the light volume of the excitation laser light beam outgoing from the fourth-order harmonics generating unit 112, that is the output level of the excitation laser light beam.

First, during the idling period $t_1$ before starting the light exposure of the wafer of the resist film A, the light volume is lowered to a minimum output (light volume) $P_n$ necessary to maintain stability in oscillations of the exposure laser light beam. Next, for exposing the wafer of the resist film a to light, the output level of the exposure light source is raised to an output $P_A$ corresponding to the sensitivity of the resist film A. During the light exposure time $t_A$ for the resist film A, the output level of the exposure laser light beam is maintained at the output $P_A$, and light exposure is carried out for each chip as the shutter is opened and closed. On completion of light exposure of the wafer of the resist film A, the output level of the exposure laser light beam is again lowered to the minimum output $P_0$. During the idling period $t_2$ until light exposure of the next wafer, the output level of the laser light beam is maintained at an output $P_0$. This output $P_0$ is of a magnitude about 10% of the output of the exposure laser light beam necessary for light exposure.

Then, for exposing the wafer of the resist film B to light, the light volume of the exposure laser light beam, that is the output level, is raised to an output $P_B$ corresponding to the sensitivity of the resist film B. During the light exposure period $t_B$ of the resist film B, the output level of the exposure laser light beam is maintained at the output $P_B$, and light exposure is carried out for each chip as the shutter is opened and closed. The sensitivity of the resist film B is in need of the light exposure energy which is larger than that of any of the films A and B. The output level $P_3$ of the exposure laser light beam is increased at this time. During the light exposure period $t_B$ of the resist film B, the output level of the exposure laser light beam is maintained at an output $P_3$, and light exposure is carried out chip by chip as the shutter 113 is opened and closed. On completion of the light exposure of the wafer of the resist film B, the output level of the laser light beam is again lowered to an output $P_0$. During the idling period $t_3$ until exposure to light of the next wafer, the output level of the laser light beam is maintained at an output $P_0$.

For exposing the wafer of the resist film C, light exposure is carried out while the light volume of the exposure laser light beam is raised to an output $P_C$ corresponding to the sensitivity of the resist film C. On completion of light exposure of the wafer of the resist film C, the light volume of the exposure laser light beam is lowered to the output $P_0$. During the idling period $t_4$ until exposure to light of the next wafer, the light volume of the exposure laser light beam is maintained at an output $P_0$.

As described above, it is possible with the light volume controller 111 to continuously adjust the light volume (output level) of the fourth-order harmonics laser light beam radiated from the fourth-order harmonics generator 112 by adjusting the output level of the excitation laser light beam radiated from the laser light source 10 in such a manner that such light volume is in the order of intensity of $P_B>P_C>P_A$ in association with the order of sensitivities of the resist films of the resist film B>resist film C>resist film A. Consequently, the volume of light exposure can be continuously adjusted depending on the sensitivities of the resist film. Of course, the hysteresis of the output level of the excitation laser light beam outputted from the laser light source 10 is similar to that shown in FIG. 3.

Meanwhile, the sensitivities of the resist films employed in the respective steps of the semiconductor light exposure process are pre-set, and data concerning the sensitivities of the resist films are supplied to the light volume controller 111 for storage therein.

During the idling periods. $t_1$, $t_2$, $t_3$ and $t_4$, the output of the exposure laser light beam is lowered to an output $P_0$ which is the minimum value necessary for maintaining oscillation stability of the exposure laser light beam output. Since the oscillation properties of the exposure laser light beam output are maintained during the idling period, it is possible to raise the light beam output to an output level of the exposure laser light beam instantly at the time of transition from the idling period to the light exposure period. Thus the light exposure can be carried out instantly without the necessity of waiting for the increase of the exposure laser light level to a pre-set value. On the other hand, there is no necessity of generating the exposure laser light beam for a pre-set time at a pre-set output necessary for light exposure for exposing the next wafer to light. The result is the reduced power consumption during the idling period. On the other hand, productivity may be improved by reducing the time required in the production process.

As for the resist film B having the larger required light exposure energy, the light exposure time $t_B$ may be reduced by increasing the exposure laser light output $P_3$. Productivity may also be improved since the light exposure time may be reduced in this manner.

While the invention has been described in conjunction with specific embodiments, it is evident that many alternatives, modifications, permutations and variations will become apparent to those skilled in the art in light of the foregoing description. Accordingly, it is intended that the present invention embrace all such alternatives, modifications and variations as fall within the scope of the appended claims.

What is claimed is:

1. A semiconductor light exposure apparatus comprising:
    an excitation light source for generating an excitation light beam;
    light beam generating means excited by said excitation light beam for generating a fundamental wavelength laser light beam, said light beam generating means including a first resonator having a first non-linear optical crystal element for wavelength-converting the fundamental wavelength laser light beam into a second-order harmonics laser light beam and a second resonator having a second non-linear optical crystal element for converting the second-order harmonics laser light beam into a fourth-order harmonics laser light beam;
    control means for controlling an output of said excitation light source in order to control an output level of the fourth-order harmonics laser light beam from said light beam generating means, wherein said control means controls said excitation light source so that the laser light beam output from said light beam generating means exposes a photosensitive coating film on a wafer during a first period of light exposure on the wafer, and wherein said control means further controls said excitation light source so that the laser light beam output from said light beam generating means has an output level necessary for maintaining stable oscillations of said excitation light source during a second period;
    a contracting optical system for projecting a pattern of the fourth-order harmonic laser light beam output from said light beam generating means in a contracted size on the wafer; and
    means for interrupting the fourth-order harmonics laser light beam from said light beam generating means, said control means controlling said interrupting means during said second period.

2. The semiconductor light exposure apparatus according to claim 1, wherein said interrupting means is provided between said light beam generating means and said contracting optical system.

3. The semiconductor light exposure apparatus comprising:
    an excitation light source for generating an excitation light beam;
    light beam generating means excited by said excitation light beam for generating a fundamental wavelength laser light beam, said light beam generating means including a first resonator having a first non-linear optical crystal element for wavelength-converting the fundamental wavelength laser light beam into a second-order harmonics laser light beam and a second resonator having a second non-linear optical crystal element for converting, the second-order harmonics laser light beam into a fourth-order harmonics laser light beam;
    control means for controlling an output of said excitation light source in order to control an output level of the fourth-order harmonics laser light beam from said light beam generating means, wherein said control means controls said excitation light source so that the laser light beam output from said light beam generating means exposes a photosensitive coating film on a wafer during a period of light exposure on the wafer, and wherein said control means controls said excitation light source so that the laser light beam output from said light beam generating means has an output level necessary for maintaining stable oscillations of the excitation light source after the end of said period of light exposure until the start of a succeeding period of light exposure;
    a contracting optical system for projecting a pattern of the fourth-order harmonics laser light beam output from said light beam generating means a contracted size on the wafer; and
    means for interrupting the fourth-order harmonics laser light output from said light beam generating means, wherein said control means controls said interrupting means after the end of said period of light exposure for the wafer, and wherein said control means controls said interrupting means before the start of a succeeding period of light exposure.

4. A semiconductor light exposure apparatus comprising:
    an excitation light source for generating an excitation light beam;
    light beam generating means having a first resonator, a second resonator and light volume controlling means, wherein
        said first resonator has a laser medium excited by a laser light beam radiated from said excitation light source and a first non-linear optical crystal element for generating a second-order harmonic laser light beam according to a fundamental wavelength laser light beam radiated from said laser medium,
        said second resonator has a second non-linear optical crystal element for generating a fourth-order harmonics laser light beam in response to the second-order harmonics laser light beam from said first resonator, and
        said light volume controlling means controls the output of said excitation light source to control the output of the fourth-order harmonics laser light beam from said second resonator wherein said light volume controlling means controls said excitation light source so that the laser light beam output from said light beam generating means exposes a photosensitive coating film on a wafer during a period of light exposure on the wafer, and wherein said light volume controlling means further controls said excitation light source so that the laser light beam output from said light beam generating means has an output level necessary for maintaining stable oscillations of said excitation light source after the end of said period of light exposure until the start of a succeeding period of light exposure;

a contracting optical system for contracting the size of a pattern on a reticle and projecting the pattern on the wafer by the fourth-order harmonics laser light beam output by said light beam generating means;

position controlling means for controlling a light exposure position of the wafer on said con acting optical system; and means for interrupting the fourth-order harmonics laser light beam from said light beam generating means, wherein said light volume controlling means controls said interrupting means after the end of said period of light exposure for the wafer, and wherein said light volume controlling means controls said interrupting means after the positioning of the wafer by said position controlling means with respect to said contracting optical system and before the start of a succeeding period of light exposure.

5. A semiconductor light exposure apparatus comprising:
a laser light source unit for providing a fourth-order harmonics laser light beam having an intensity distribution, said laser light source unit including:
a fourth harmonics wave generator for providing said fourth harmonic laser light beam, and
a light volume controller for adjusting the light volume of said fourth harmonics laser light beam and providing a first adjusted laser light beam;
a uniforming unit for receiving said fourth order harmonics laser light beam, for uniforming the intensity distribution of said fourth-order harmonics laser light beam, and for providing an output;
a light exposure unit for receiving the output of said uniforming unit and for providing a contracted pattern on a wafer;
a position control unit for forming the contracted pattern at a desired position on said wafer; and
a shutter receiving said first adjusted laser light beam, said shutter being controlled by said light volume controller to be periodically opened and closed to output said first adjusted laser light beam.

6. A semiconductor light exposure apparatus comprising:
a laser light source unit for providing a fourth-order harmonics laser light beam having an intensity distribution, said laser light source unit including:
an excitation light source for generating an excitation laser light beam,
a wave generating unit for receiving said excitation light beam and generating a fundamental wavelength laser light beam,
second harmonic generating means for receiving said fundamental wavelength laser light beam and providing a second harmonic laser light beam therefrom, said second harmonic generating means having:

a first non-linear optical crystal element for wavelength-converting said fundamental wavelength laser light beam into said second harmonic laser light beam, and
first mirror means for generating resonation at the wavelength of said fundamental wavelength laser light beam, said first mirror means further having
a first concave mirror for reflecting said fundamental wavelength laser light beam and said second harmonic laser light beam, and
planar mirror means for reflecting said fundamental wavelength laser light beam and transmitting said second harmonic laser light beam;
phase modulation means for modulating the phase of said second harmonic light beam and for providing a modulated second harmonic laser light beam,
fourth harmonic generating means for converting the wavelength of said modulated second harmonic laser light beam into a fourth harmonic laser light beam, and
control means for detecting the light volume of said fourth harmonic laser light beam and controlling said fourth harmonic generating means in response to said detected light volume;
a uniforming unit for receiving said fourth-order harmonics laser light beam, for uniforming the intensity distribution of said fourth-order harmonics laser light beam, and for providing an output;
a light exposure unit for receiving the output of said uniforming unit and for providing a contracted pattern on a wafer; and
a position control unit for forming the contracted pattern at a desired position on said wafer.

7. A semiconductor light exposure apparatus comprising:
a laser light source unit for providing a fourth-order harmonics laser light beam having an intensity distribution, said laser light source unit including:
an excitation light source for generating an excitation laser light beam,
a wave generating unit for receiving said excitation light beam and generating a fundamental wavelength laser light beam,
second harmonic generating means for receiving said fundamental wavelength light beam and providing a second harmonic laser light beam therefrom,
phase modulation means for modulating the phase of said second harmonic laser light beam and for providing a modulated second harmonic laser light beam,
fourth harmonic generating means for converting the wavelength of said modulated second harmonic laser light beam into a fourth harmonic laser light beam,
control means for detecting the light volume of said fourth harmonic laser light beam and controlling said fourth harmonic generating means in response to said detected light volume, and
said phase modulation means having a phase modulator for phase-modulating said second harmonic laser light beam in order to detect the light volume of said control means, and an optical isolator for preventing reversion of said second harmonic laser light beam incident on said phase modulator;
a uniforming unit for receiving said fourth-order harmonics laser light beam, for uniforming the intensity distribution of said fourth-order harmonics laser light beam, and for providing an output;

a light exposure unit for receiving the output of said uniforming unit and for providing a contracted pattern on a wafer; and a position control unit for forming the contracted pattern at a desired position on said wafer.

8. A semiconductor light exposure apparatus comprising:

a laser light source unit for providing a fourth-order harmonics laser light beam having an intensity distribution, said laser light source unit including:

an excitation light source for generating an excitation laser light beam, a wave generating unit for receiving said excitation light beam and generating a fundamental wavelength laser light beam, second harmonic generating means for receiving said fundamental wavelength light beam and providing a second harmonic laser light beam therefrom, phase modulation means for modulating the phase of said second harmonic light beam and for providing a modulated second harmonic laser light beam, fourth harmonic generating means for converting the wavelength of said modulated second harmonic laser light beam into said fourth harmonic laser light beam, said fourth harmonic generating means having:

a second non-linear optical crystal element for wavelength-converting said second harmonics laser light beam into said fourth harmonics laser light beam, third mirror means for transmitting said fourth harmonics laser light beam, and second mirror means for increasing the laser light of said fourth harmonics laser light beam, said second mirror means further having two planar mirrors for transmitting said fourth harmonics laser light beam, each of said planar mirrors facing said third mirror means, and control means for detecting the light volume of said fourth harmonic laser light beam and controlling said fourth harmonic generating means in response to said detected light volume;

a uniforming unit for receiving said fourth-order harmonics laser light beam, for uniforming the intensity distribution of said fourth-order harmonics laser light beam, and for providing an output;

a light exposure unit for receiving the output of said uniforming unit and for providing a contracted pattern on a wafer; and a position control unit for forming the contracted pattern at a desired position on said wafer.

9. The semiconductor apparatus of claim 8, wherein said third mirror means comprise two concave mirrors and wherein said two concave mirrors and said second non-linear optical crystal element are arranged along a first optical axis.

10. The semiconductor apparatus of claim 9, wherein said control means comprises:

photodetecting means for detecting the light volume of said fourth harmonics laser light beam;

lock circuit means for providing position error detection according to said detected light volume;

voice coil motor means for driving one of said concave mirrors along said first optical axis in response to said detected position error provided by said lock circuit means.

11. The semiconductor apparatus of claim 10, wherein said lock circuit means provides said detected position error to said phase modulating means.

\* \* \* \* \*